(12) United States Patent
Zimmer et al.

(10) Patent No.: US 9,620,707 B2
(45) Date of Patent: Apr. 11, 2017

(54) MAGNETORESISTIVE DEVICES AND METHODS FOR MANUFACTURING MAGNETORESISTIVE DEVICES

(71) Applicant: Infineon Technologies AG, Neubiberg (DE)

(72) Inventors: Juergen Zimmer, Neubiberg (DE); Andreas Strasser, Regensburg (DE); Wolfgang Raberg, Sauerlach (DE); Klemens Pruegl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/688,177

(22) Filed: Apr. 16, 2015

(65) Prior Publication Data

US 2016/0308120 A1    Oct. 20, 2016

(51) Int. Cl.
| | | |
|---|---|---|
| H01L 21/02 | (2006.01) | |
| H01L 43/08 | (2006.01) | |
| H01L 43/12 | (2006.01) | |
| H01L 43/02 | (2006.01) | |
| H01L 27/22 | (2006.01) | |

(52) U.S. Cl.
CPC .............. *H01L 43/08* (2013.01); *H01L 43/02* (2013.01); *H01L 43/12* (2013.01); *H01L 27/224* (2013.01); *H01L 27/228* (2013.01)

(58) Field of Classification Search
CPC ..... H01L 27/224; H01L 27/228; H01L 43/02; H01L 43/08; H01L 43/12
See application file for complete search history.

(56) References Cited

U.S. PATENT DOCUMENTS

| | | | |
|---|---|---|---|
| 2004/0041182 A1* | 3/2004 | Tuttle | B82Y 25/00 257/295 |
| 2010/0178714 A1* | 7/2010 | Cho | H01L 43/12 438/3 |
| 2015/0194597 A1* | 7/2015 | Fermon | G01R 33/093 257/421 |

* cited by examiner

*Primary Examiner* — Su C Kim
(74) *Attorney, Agent, or Firm* — Schiff Hardin LLP

(57) ABSTRACT

A magnetoresistive device can include a first magnetic layer structure having a first length, a barrier layer disposed on the first magnetic layer structure, a second magnetic layer structure disposed on the barrier layer and having a second length that is less than the first length.

18 Claims, 5 Drawing Sheets

MAGNETORESISTIVE DEVICES AND METHODS FOR MANUFACTURING MAGNETORESISTIVE DEVICES

BACKGROUND

Field

Embodiments described herein generally relate to magnetoresistive devices and methods for manufacturing the same, including magnetoresistive sensors and methods of manufacturing such sensors.

Related Art

Magnetoresistive devices may be based on one or more magnetoresistive technologies—including, for example, tunnel magnetoresistive (TMR), giant magnetoresistive (GMR), anisotropic magnetoresistive (AMR), and/or one or more other magnetoresistive technologies as would be understood by those skilled in the relevant art(s)—that may collectively be referred to as xMR technologies. The magnetoresistive technologies can be configured using various electrical contact configurations, for example, a current in plane (CIP) configuration or a current perpendicular to plane (CPP) configuration. In the CIP configuration, current flows parallel to the layer system of the magnetoresistive device between electrical contacts disposed on a same side of the device, whereas in the CPP configuration, current flows perpendicular to the layer system between electrical contacts disposed on opposing sides of the device.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIGS. 1(a) and 1(b) illustrate schematic cross sectional views of layer structures according to an exemplary embodiment of the present disclosure.

FIGS. 2(a) and 2(b) illustrate schematic cross sectional views of layer structures according to an exemplary embodiment of the present disclosure.

FIG. 3 illustrates an example relationship of magnetoresistive effects of a layer structure with respect to a magnetic field according to an exemplary embodiment of the present disclosure.

FIGS. 4(a)-4(d) illustrate cross-sectional views of a method for manufacturing a magnetoresistive device according to an exemplary embodiment of the present disclosure.

The exemplary embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

Figure 1B:
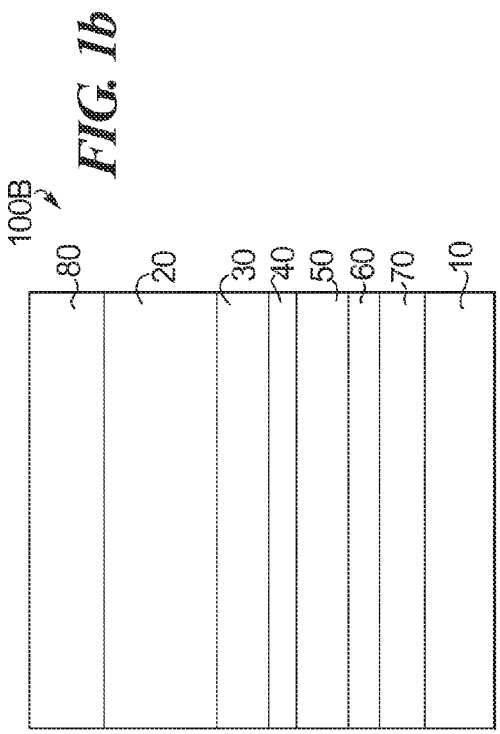
Figure 1A:
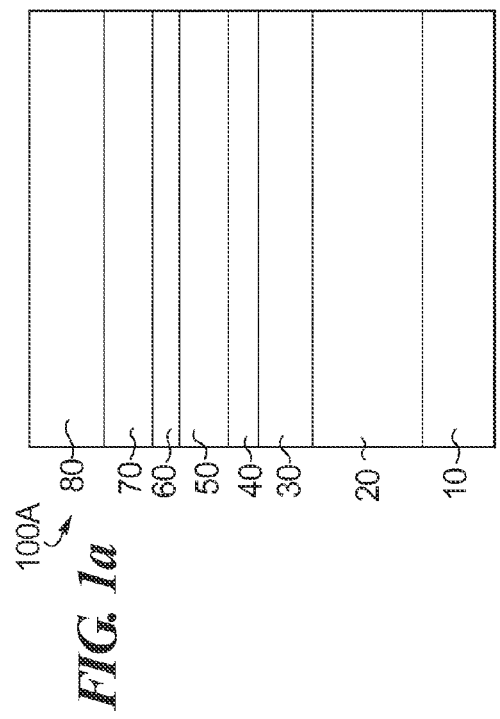

FIGS. 1(a) and 1(b) illustrate schematic cross sectional views of layer structures 100A and 100B, respectively, of magnetoresistive devices according to exemplary embodiments of the present disclosure. FIG. 1(a) illustrates a schematic cross sectional view of a layer structure of a magnetoresistive device having a bottom spin value (BSV) configuration. In BSV configurations, a free layer 70 is disposed above a pinned layer 30 as illustrated in FIG. 1(a). FIG. 1(b) illustrates a schematic cross sectional view of a layer structure of a magnetoresistive device having a top spin value (TSV) configuration. In TSV configurations, the pinned layer 30 is disposed above the free layer 70 as illustrated in FIG. 1(b).

The layer structures of the magnetoresistive devices 100A and 100B can each include a seed layer 10, an antiferromagnetic layer 20, a pinned layer 30, a coupling layer 40, a reference layer 50, a barrier layer 60, a free layer 70, and a cap layer 80.

In the BSV configuration of the magnetoresistive devices as illustrated in FIG. 1(a), the antiferromagnetic layer 20 is disposed on the seed layer 10, the pinned layer 30 is disposed on the antiferromagnetic layer 20, the coupling layer 40 is disposed on the pinned layer 30, the reference layer 50 is disposed on the coupling layer 40, the barrier layer 60 is disposed on the reference layer 50, the free layer 70 is disposed on the barrier layer 60, and the cap layer 80 is disposed on the free layer 70.

In the TSV configuration of the magnetoresistive devices as illustrated in FIG. 1(b), the free layer 70 is disposed on the seed layer 10, the barrier layer 60 is disposed on the free layer 70, the reference layer 50 is disposed on the barrier layer 60, the coupling layer 40 is disposed on the reference layer 50, the pinned layer 30 is disposed on the coupling layer 40, the antiferromagnetic layer 20 is disposed on the pinned layer 30, and the capping layer 80 is disposed on the antiferromagnetic layer 20. In an exemplary embodiment, two or more of the various layers can be parallel or substantially parallel to each other. For example, the free layer 70 can be parallel or substantially parallel to the seed layer 10, the barrier layer 60, the reference layer 50, the coupling layer 40, the pinned layer 30, the antiferromagnetic layer 20, and/or the capping layer 80.

In an exemplary embodiment, free layer 70 can be referred to as a "first magnetic layer structure" and the antiferromagnetic layer 20, the pinned layer 30, the coupling layer 40, and the reference layer 50 can collectively be referred to as a "second magnetic layer structure." In this example, the first magnetic layer structure is separated from the second magnetic layer structure by the barrier layer 60. With reference to the TSV configuration illustrated in FIG. 1(b), the second magnetic layer structure is disposed on the barrier layer 60, which is disposed on the first magnetic layer structure. Conversely, and with reference to the BSV configuration illustrated in FIG. 1(a), the first magnetic layer structure is disposed on the barrier layer 60, which is disposed on the second magnetic layer structure.

The seed layer 10 can include one or more of, for example, Cu, CuN, Ru, Ta, TaN, NiFe, NiCr, NiFeCr, and/or one or more other materials and/or compounds as would be understood by those skilled in the relevant arts. The seed layer 10 can have a thickness of, for example, 5 nm, but is not limited to this exemplary thickness.

The antiferromagnetic layer 20 can include one or more of, for example, PtMn, NiMn, IrMn, and/or one or more other materials and/or compounds as would be understood by those skilled in the relevant arts. The antiferromagnetic layer 20 can have a thickness ranging from, for example, 5 to 50 nm, or a thickness ranging from, for example, 15 to 30 nm. In an exemplary embodiment, the antiferromagnetic layer 20 has a thickness of, for example, 25 nm.

The pinned layer 30 can include one or more of, for example, CoFe, CoFeB, NiFe, CoFeNi, and/or one or more other materials and/or compounds as would be understood by those skilled in the relevant arts. The pinned layer 30 can have a thickness ranging from, for example, 1 to 5 nm, or a thickness ranging from, for example, 2 to 3 nm. In an exemplary embodiment, the pinned layer 30 has a thickness of, for example, 2 nm.

The coupling layer 40 can include one or more of, for example, Ru, Cu, and/or one or more other materials and/or compounds as would be understood by those skilled in the relevant arts. The coupling layer 40 can have a thickness ranging from, for example, 0.5 to 3 nm. In an exemplary embodiment, the coupling layer 40 has a thickness of, for example, 1 nm.

The reference layer 50 can include one or more of, for example, CoFe, CoFeB, NiFe, CoFeNi, and/or one or more other materials and/or compounds as would be understood by those skilled in the relevant arts. The reference layer 50 can have a thickness ranging from, for example, 1 to 5 nm, or a thickness ranging from, for example, 2 to 3 nm. In an exemplary embodiment, the reference layer 50 has a thickness of, for example, 2 nm.

In exemplary embodiments where the magnetoresistive layer stack exhibits a TMR effect, the barrier layer 60 can include one or more of, for example, magnesium oxide (MgO), aluminum oxide ($Al_2O_3$), and/or one or more other materials and/or compounds as would be understood by those skilled in the relevant arts. In exemplary embodiments where the magnetoresistive layer stack exhibits a GMR effect, the barrier layer 60 can be, for example, Cu, Ag, Au and/or one or more other materials and/or compounds as would be understood by those skilled in the relevant arts. The barrier layer 60 can have a thickness ranging from, for example, 0.5 to 2 nm. In an exemplary embodiment, the barrier layer 60 has a thickness of, for example, 1 nm.

The free layer 70 can include one or more of, for example, CoFe, CoFeB, NiFe, CoFeNi, and/or one or more other materials and/or compounds as would be understood by those skilled in the relevant arts. The free layer 70 can have a thickness ranging from, for example, 1 to 15 nm, or a thickness ranging from, for example, 2 to 3 nm. In an exemplary embodiment, the free layer 70 has a thickness of, for example, 3 nm.

The materials and/or compounds of the various layers are not limited to the exemplary materials and/or compounds discussed herein, and one or more of the layers can comprise one or more other compounds and/or materials as would be understood by those skilled in the relevant arts. Similarly, the thicknesses and thickness ranges of the various layers are not limited to the exemplary thickness values discussed herein, and one or more of the layers can have a different thickness as would be understood by those skilled in the relevant arts.

Figure 2B:
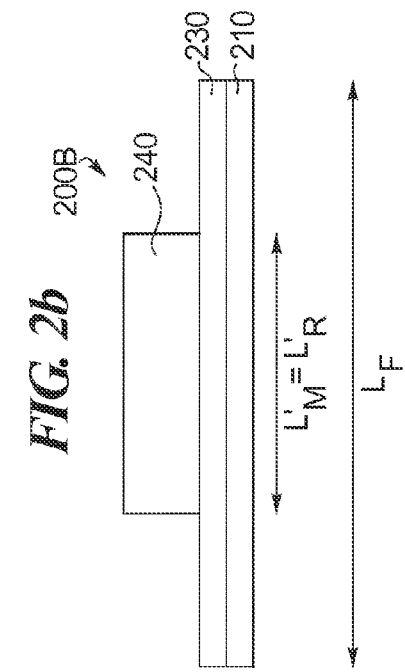
Figure 2A:
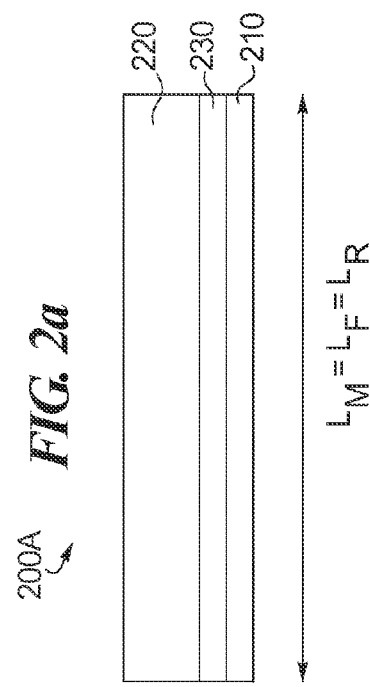

FIG. 2(a) illustrates a schematic cross sectional view of a layer structure 200A of a magnetoresistive device according to an exemplary embodiment of the present disclosure. The layer structure 200A includes a barrier layer 230 disposed between a first magnetic layer structure 210 and a second magnetic layer structure 220.

The first magnetic layer structure 210 can be an embodiment of the first magnetic layer structure as described with reference to FIGS. 1(a) and 1(b). In this example, the first magnetic layer structure 210 includes a free layer, which is an embodiment of the free layer 70. Similarly, the second magnetic layer structure 220 includes an antiferromagnetic layer, a pinned layer, a coupling layer, and a reference layer, which respectively are embodiments of the antiferromagnetic layer 20, the pinned layer 30, the coupling layer 40, and the reference layer 50 discussed with reference to FIGS. 1(a) and 1(b).

In operation, the layer structure 200A produces a magnetoresistive effect in portions of the layer structure 200A in which the second magnetic layer structure 220 (configured as a "reference layer") overlaps the first magnetic layer structure 210 (configured as a "free layer").

As illustrated in FIG. 2(a), the length of the second magnetic layer structure 220, which can be referred to as a reference layer length ($L_R$) is equal or substantially equal to the length of the first magnetic layer structure 210, which can be referred to as a free layer length ($L_F$). In this configuration, the magnetoresistive effect is produced along a length $L_M$, where $L_M=L_F=L_R$. In this example, $L_M$ represents the length along the cross section of the layer structure 200A in which the second magnetic layer structure 220 overlaps the first magnetic layer structure 210. That is, because $L_F=L_R$, the magnetoresistive effect is produced along the entire length, or substantially all of the length, of the first magnetic layer structure 210 (i.e., the length $L_F$), which is equal to or substantially equal to the length of the second magnetic layer structure 220 (i.e., the length $L_R$). In an exemplary embodiment, the reference layer length ($L_R$) extends parallel or substantially parallel to the free layer length ($L_F$). Further, the length $L_M$ in which the magnetoresistive effect is produced can extend parallel or substantially parallel to the reference layer length ($L_R$) and/or the free layer length ($L_F$).

Figure 6A:
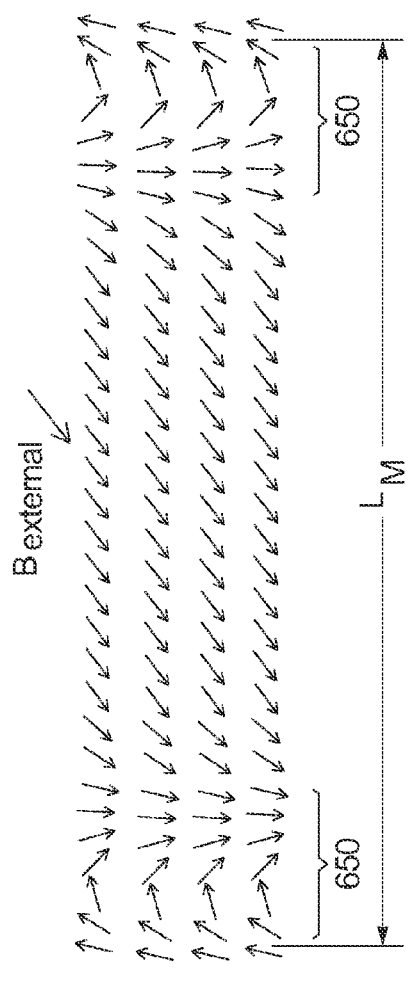
FIG. 6(a) illustrates a magnetoresistive effect produced by a layer structure according to an exemplary embodiment of the present disclosure.

An exemplary embodiment of the magnetization of the domains over the length $L_M$ in the layer structure 200A is illustrated in FIG. 6(a). Here, $L_M=L_F=L_R$. In operation, the demagnetizing field forces at the structure edge of the layer structure 200A cause the magnetization of one or more ferromagnetic layers to align along the structure edge, thereby preventing the domains from being ideally aligned along an external magnetic field ($B_{external}$). At the same time, the domains near the interior portion align better along the external magnetic field ($B_{external}$). As a result, domain walls 650 may be generated leading to discontinuities in the response signal during their generation and annihilation, as it can be seen in FIG. 6(b) at a field angle of approximately 195° or a field angle of approximately 320°. Furthermore, the xMR signal height dR/R may be reduced as can be seen from the maximum and minimum GMR signals significantly deviating from 1 or 0, respectively. This alignment may cause variations in the magnetization of the layer structure 200A. Further, deposition and structuring (e.g., etching) processes may result in the formation of domain walls 650 near the edges of the layer structure 200A.

As will be understood by those skilled in the relevant arts, the various lengths illustrated in the cross-sectional view of the layer structure 200A define corresponding perimeters of the respective layers, where the each perimeter defines an area of the corresponding layer. For example, the length $L_F$ of the first magnetic layer structure 210 and a width (e.g., extending in to and/or out of the page) of the first magnetic layer structure 210 define a perimeter and area of the first magnetic layer structure 210. In exemplary embodiments in which one or more lengths are modified, it should be understood that the overall perimeter and area of the layer defined by that corresponding length is also modified. For example, if the length is reduced, it should be understood that the perimeter and area of the corresponding layer is also reduced.

Figure 6B:
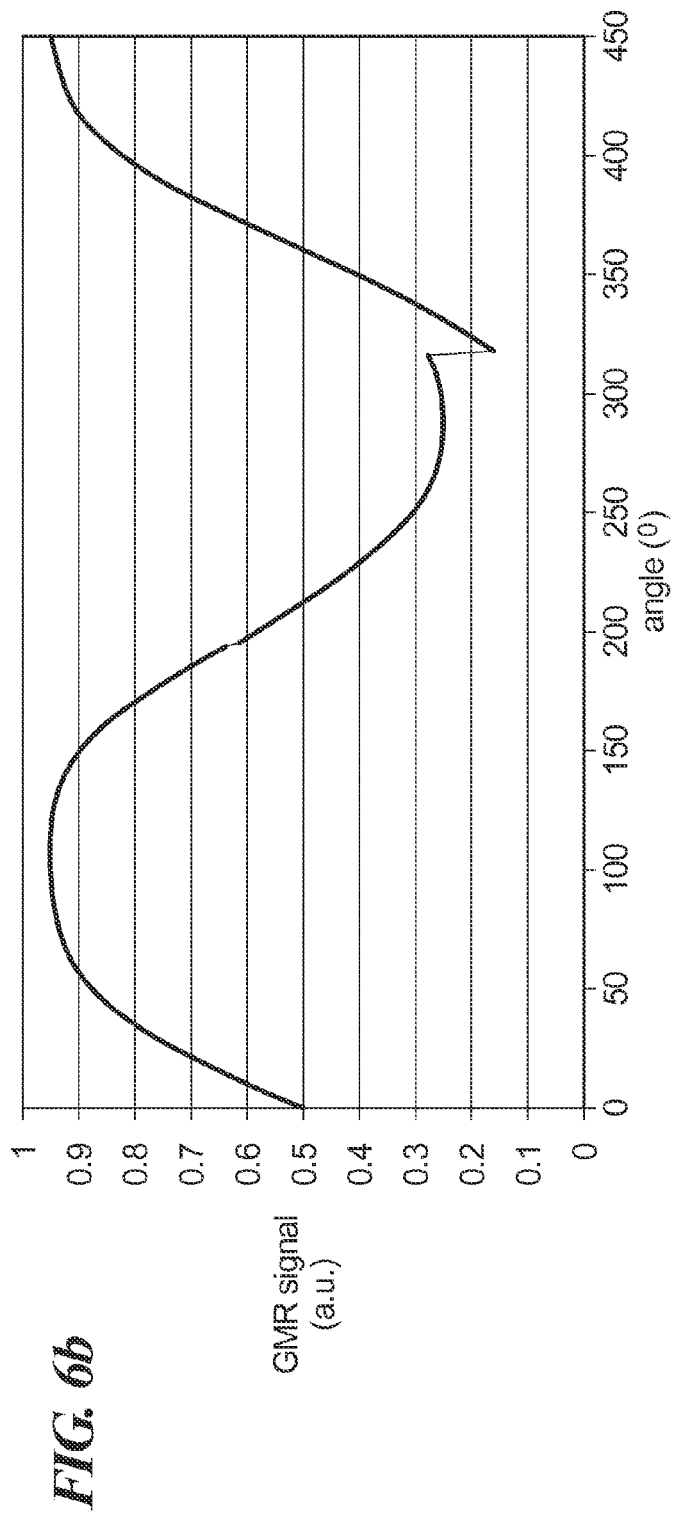
FIG. 6(b) illustrates an example relationship of magnetoresistive effect with respect to angular position according to an exemplary embodiment of the present disclosure.

FIG. 6(b) illustrates the relationship of the magnetoresistive effect produced by the layer structure 200A with respect to angular position in the presence of a rotational external magnetic field ($B_{external}$). As discussed above, the generation and annihilation of domain walls can lead to discontinuities in the magnetoresistive signal because the whole length $L_M$ fully contributes to the signal.

FIG. 2(b) illustrates a schematic cross sectional view of a layer structure 200B of a magnetoresistive device according to an exemplary embodiment of the present disclosure. The layer structure 200B includes a barrier layer 230 disposed between a first magnetic layer structure 210 and a second magnetic layer structure 240. The second magnetic layer structure 240 is similar to the second magnetic layer structure 220, but has a length $L'_R$ that is less than the length $L_R$ of the second magnetic layer structure 220. In this example, $L'_R < L_R$ and $L'_R < L_F$. That is, unlike in the layer structure 200A, the length $L'_R$ of the second magnetic layer structure 240 is not equal to or substantially equal to the length $L_F$ of the first magnetic layer structure 210.

As discussed above, a magnetoresistive effect is produced in portions of the layer structure 200B in which the second magnetic layer structure 240 overlaps the first magnetic layer structure 210. In this example, the magnetoresistive effect is produced along a length $L'_M$, where $L'_M = L'_R$ as $L'_R < L_F$. In this example, $L'_M$ represents the length along the cross section of the layer structure 200B in which the second magnetic layer structure 240 overlaps the first magnetic layer structure 210 (i.e., the length at which the magnetoresistive effect is produced). In an exemplary embodiment, the length ($L'_R$) of the second magnetic structure 240 extends parallel or substantially parallel to the length ($L_F$) of the first magnetic layer structure 210. Further, the length $L'_M$ in which the magnetoresistive effect is produced can extend parallel or substantially parallel to the length $L'_R$ and/or the length $L_F$.

In an exemplary embodiment, length $L'_R$ of the second magnetic layer structure 240 (and corresponding perimeter and area) can range from 10% to 90% of the length $L_F$ (and corresponding area) of the first magnetic layer structure 210. In another exemplary embodiment, length $L'_R$ of the second magnetic layer structure 240 (and corresponding perimeter and area) can range from, for example, 30% to 60% of the length $L_F$ (and corresponding perimeter area) of the first magnetic layer structure 210. However, the ratio of lengths (and corresponding perimeters and areas) are not limited to these exemplary ratios, and can be any length (perimeter/area) ratio as would be understood by one of ordinary skill in the relevant arts that results in a configuration in which the magnetoresistive effect is produced in one or more areas that are laterally spaced from the edges of the magnetoresistive layer structure.

Figure 7A:
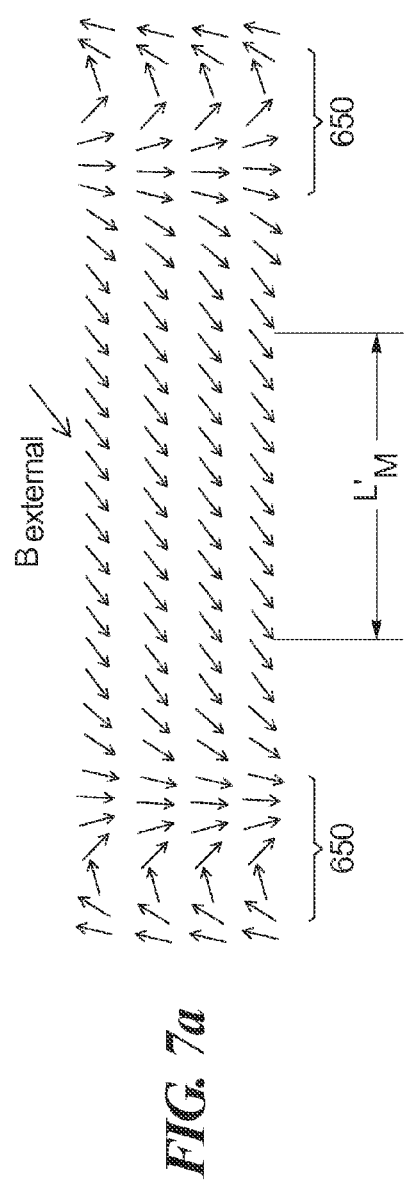
FIG. 7(a) illustrates a magnetoresistive effect produced by a layer structure according to an exemplary embodiment of the present disclosure.

An exemplary embodiment of the magnetization of the domains over the length $L'_M$, where $L'_M = L'_R$, in the layer structure 200B is illustrated in FIG. 7(a). In this example, the magnetoresistive effect is produced in the reduced area spanning the length $L'_M$, which is positioned away from the domain walls 650 as a result of the reduced length $L'_R$ of the first magnetic layer structure 210.

As discussed above, the demagnetizing field forces at the structure edge of the layer structure 200B cause the magnetization of one or more ferromagnetic layers to align along the structure edge. This alignment may cause variations in the magnetization of the layer structure 200B. Further, deposition and structuring (e.g., etching) processes may result in the formation of domain walls 650 near the edges of the layer structure 200B. The edge alignment and domain walls 650 may introduce inefficiencies in the produced magnetoresistive effect, which may result in inaccuracies in the angular accuracy or other measurements utilizing the magnetoresistive effect.

However, by reducing the length (and corresponding perimeter and area) of the second magnetic layer structure 240, and thereby reducing the length (and corresponding area) in which the second magnetic layer structure 240 and the first magnetic layer structure 210 overlap, the magnetoresistive effect produced by the layer structure 200B can be limited to this reduced overlapping area. Further, by having the overlapping area located near the interior portion (e.g., near the center) of the layer structure 200B and spaced from the edges of the first magnetic layer structure 210, the generation and annihilation of the domain walls 650 are at least partially eliminated from the magnetoresistive signal. In this example, the perimeter of the second magnetic layer structure 240 (that includes the length $L'_R$) that defines the area of the second magnetic layer structure 240 is less than the perimeter of the first magnetic layer structure 210 that defines the area of the first magnetic layer structure 210. In an exemplary embodiment, the perimeter of the second magnetic layer structure 240 is spaced from the perimeter of the first magnetic layer structure 210. That is, each edge of the second magnetic layer structure 240 is spaced from each corresponding edge of the first magnetic layer structure 210.

Figure 7B:
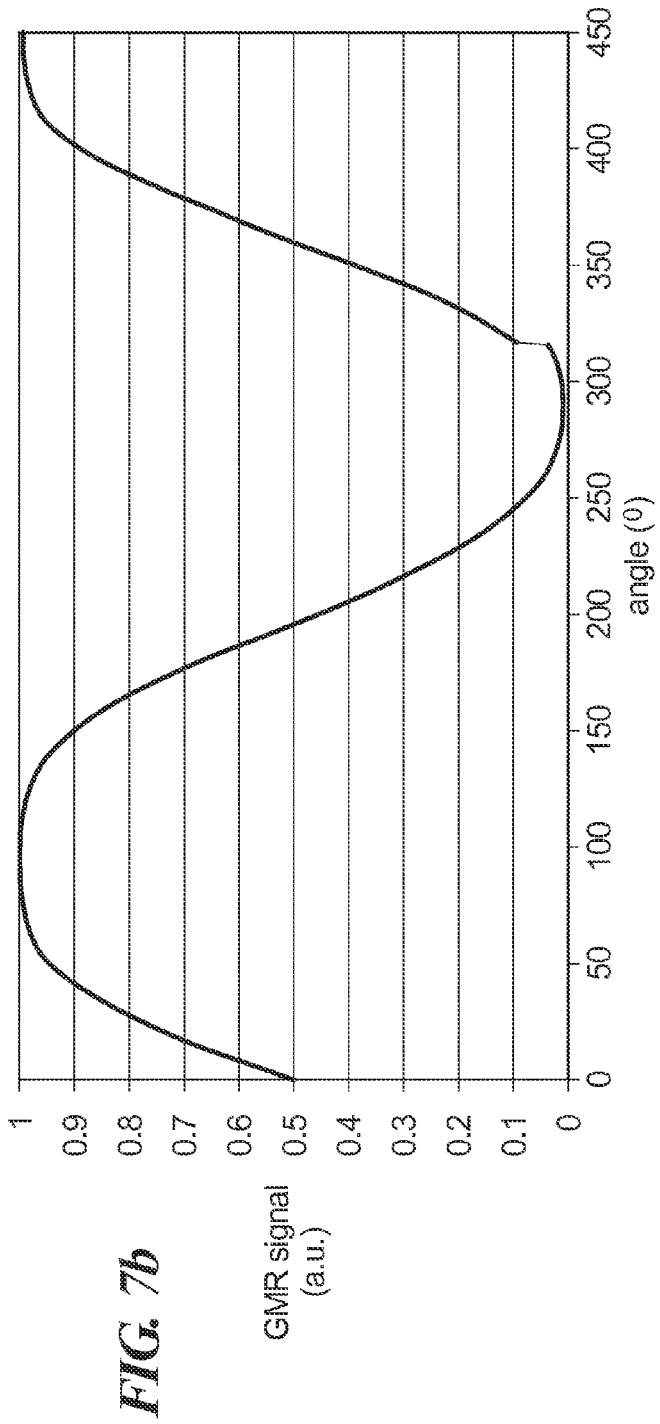
FIG. 7(b) illustrates an example relationship of magnetoresistive effect with respect to angular position according to an exemplary embodiment of the present disclosure.

FIG. 7(b) illustrates the relationship of the magnetoresistive effect produced by the layer structure 200B with respect to angular position in case of a rotational external magnetic field ($B_{external}$). In this example, the magnetoresistive effect produces a more accurate and efficient magnetoresistive signal when compared to the magnetoresistive signal produced by the layer structure 200A. Because the generation and annihilation of the domain walls is now outside the magnetoresistive active area, the signal exhibits reductions in pronounced discontinuities.

As discussed above, those skilled in the relevant arts will understand that the various lengths illustrated in the cross-sectional view of the layer structure 200B define corresponding perimeters and areas of the respective layers. For example, the length $L'_R$ of the second magnetic layer structure 240 and a width (e.g., extending in to and/or out of the page) of the second magnetic layer structure 240 define a perimeter and an area of the second magnetic layer structure 240. In exemplary embodiments in which one or more lengths are modified, it should be understood that the overall perimeter and area of the layer defined by the modified length(s) are also modified. For example, if a length is reduced, it should be understood that the perimeter and area of the corresponding layer is also reduced.

Further, the various layers of the layer structures can be configured in various shapes (e.g., in plan view), including, for example, rectangles, squares, other n-side polygons, ellipses, circles, or any other shape as would be understood by those of skilled in the relevant arts. For example, if the second magnetic layer structure 240 has a rectangular shape, the first magnetic layer structure 210 can have a rectangular shape whose edges are spaced outwardly from the edges of the second magnetic layer structure 240. Further, the various layers can have different shape configurations from each other. For example, the second magnetic layer structure 240 can have a rectangular shape while the first magnetic layer structure 210 has an elliptical shape. In this example, the perimeter (edges) of the elliptically-shaped first magnetic layer structure 210 would be spaced outwardly from the perimeter (edges) of the rectangular shaped second magnetic layer structure 240.

Figure 3:
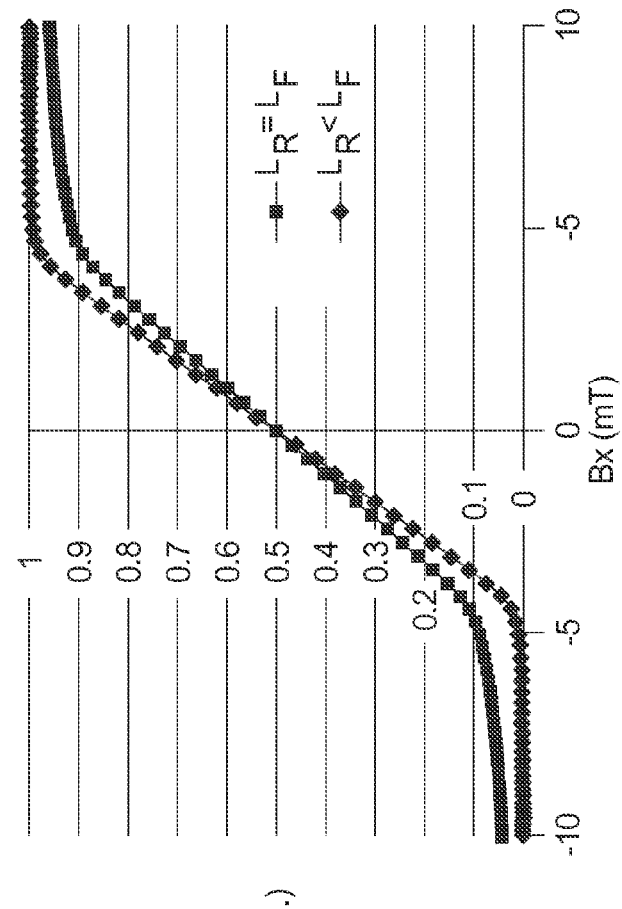

FIG. 3 illustrates the relationship of the magnetoresistive effects of the layer structures 200A and 200B with respect to a non-rotational magnetic field. For example, the magnetoresistive effect generated by the layer structure 200B produces a magnetoresistive signal having a linear portion extending from, approximately −4.5 to 4.5 mT, while magnetoresistive effect generated by the layer structure 200A produces a magnetoresistive signal having a smaller portion extending from, approximately −2.5 to 2.5 mT. That is, the magnetoresistive effect generated by the layer structure 200B produces a magnetoresistive signal having increased uniformity and accuracy by avoiding or reducing inaccuracies that may be introduced by a magnetoresistive effect generated near one or more domain walls or near the edge domains which are magnetically stabilized by the demagnetizing field.

Consequently, in response to one or more varying external magnetic fields, the layer structure 200B can produce a beneficial magnetoresistive signal. In these examples, the varying external magnetic fields can be, for example, rotational (e.g., circular or elliptical) external magnetic fields, axial external magnetic fields, or a combination of both.

FIGS. 4(a)-4(d) schematically illustrate a cross-sectional view of a method for manufacturing a magnetoresistive device having a layer structure 200B in accordance with an exemplary embodiment of the present disclosure. The method may be integrated in semiconductor manufacturing process.

Figure 5:
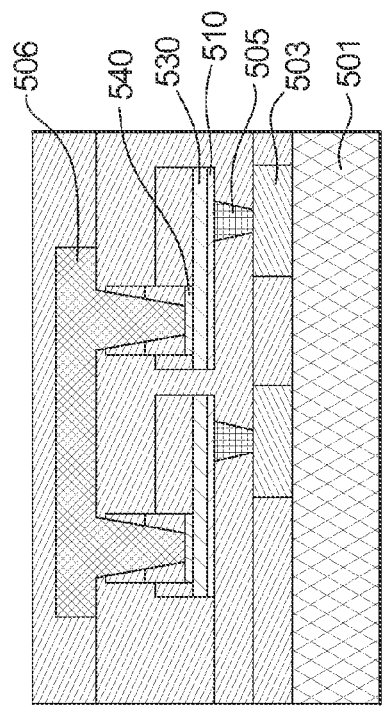
FIG. 5 illustrates a magnetoresistive device according to an exemplary embodiment of the present disclosure.

In an exemplary embodiment, the magnetoresistive device having a layer structure 200B may be configured to operate as a GMR or TMR device having a CIP configuration. As illustrated in FIGS. 4(a)-4(d), the layer structure 200B has a TSV configuration. However, the described method may also be employed for manufacturing magnetoresistive devices that may be based on other xMR technologies and/or configurations. For example, FIG. 5 illustrates a magnetoresistive device having a layer structure 200B that is implemented as a TMR device having a CPP configuration. The magnetoresistive device of FIG. 5 includes a substrate 501, wiring metal 503, interconnect 505, first magnetic layer structure 510, barrier layer 530, second magnetic layer structure 540, and interconnect 506. Discussion of these elements has been omitted for brevity as these components are similar to the corresponding components illustrated in FIGS. 1(a)-2(b) and 4(a)-4(d).

Figure 4A:
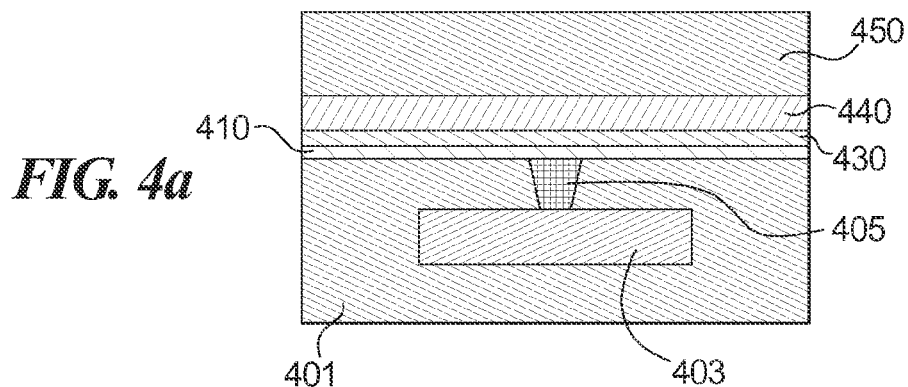

In FIG. 4(a), a substrate 401 having a wiring metal 403 and an interconnect 405 is provided. The substrate 401 may include or be made of an electrically insulating material, for example silicon oxide ($SiO_2$), silicon nitride ($Si_3N_4$), and/or one or more other materials and/or compounds as would be understood by one of ordinary skill in the relevant arts.

With continued reference to FIG. 4(a), a first magnetic layer structure 410 is provided and disposed on the substrate 401, a barrier layer 430 is provided and disposed on first magnetic layer structure 410, and a second magnetic layer structure 440 is provided and disposed on the barrier layer 430. A hard mask 450 is then provided and disposed on the second magnetic layer structure 440. The first magnetic layer structure 410, the barrier layer 430, and the second magnetic layer structure 440 can be embodiments of the first magnetic layer structure 210, the barrier layer 230, and the second magnetic layer structure 240 as described above with reference to FIGS. 2(a) and 2(b).

In an exemplary embodiment, the first magnetic layer structure 410, barrier layer 430, second magnetic layer structure 440, and/or hard mask 450 are deposited using one or more deposition processes, including, for example, physical vapor deposition (PVD), chemical vapor deposition (CVD), and/or one or more other deposition processes as would be understood by one of ordinary skill in the relevant arts.

Figure 4B:
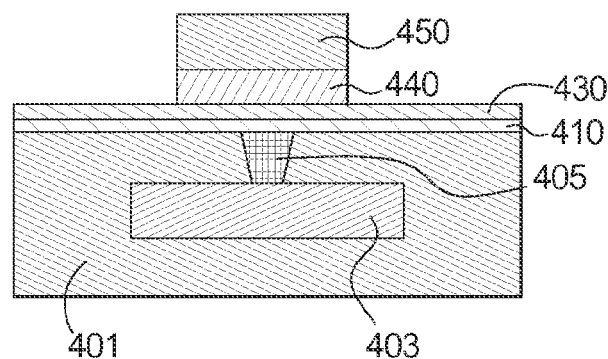

In FIG. 4(b), a portion of the hard mask 450 and underlying second magnetic layer structure 440 are removed to expose a portion of the barrier layer 430.

In an exemplary embodiment, the portion of the hard mask 450 and underlying second magnetic layer structure 440 are removed using one or more structuring (e.g., etching) processing, including, for example, Reactive-ion etching (RIE), Ion beam etching (IBE), one or more other plasma etching processes, one or more chemical etching processes, and/or one or more other etching processes as would be understood by one of ordinary skill in the relevant arts.

In an exemplary embodiment, the etching of portion of the hard mask 450 and the portion of the underlying second magnetic layer structure 440 are performed in separate etching processes. However, the etching of the hard mask 450 and second magnetic layer structure 440 can be performed in a single etching process.

In another exemplary embodiment, the process of removing the second magnetic layer structure 440 can also remove the barrier layer 430 completely or partially.

Figure 4C:
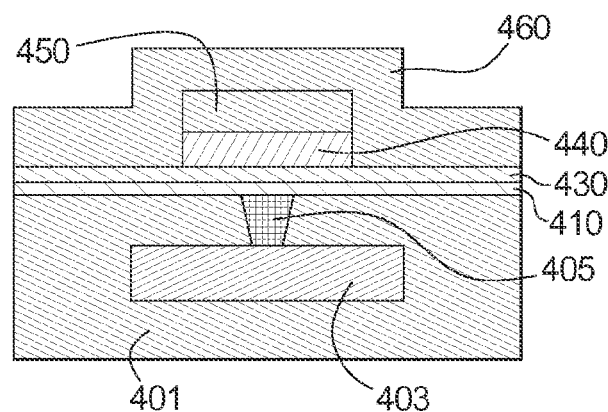

In FIG. 4(c), a hard mask 460 is then provided and disposed on the hard mask 450 and the exposed portion(s) of the barrier layer 430. In an exemplary embodiment, hard mask 460 is deposited using one or more deposition processes, including, for example, physical vapor deposition (PVD), chemical vapor deposition (CVD), and/or one or more other deposition processes as would be understood by one of ordinary skill in the relevant arts.

In an exemplary embodiment, the hard mask 460 includes a self-aligned spacer that is disposed on a portion of the exposed barrier layer 430 and on exposed edges of the hard mask 450 and second magnetic layer structure 440.

Figure 4D:
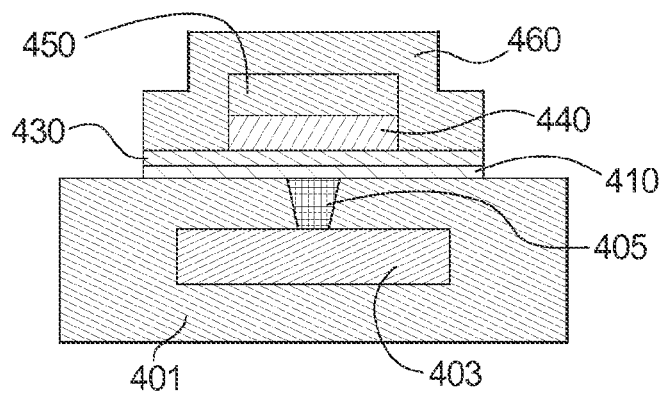

In FIG. 4(d), a portion of the hard mask 460 disposed on the exposed portion(s) of the barrier layer 430, a portion of the underlying barrier layer 430, and a portion of the underlying first magnetic layer structure 410 are removed to expose a portion of the substrate 401.

In an exemplary embodiment, the portion of the hard mask 460, underlying barrier layer 430 and first magnetic layer structure 410 are removed using one or more structuring (e.g., etching) processing, including, for example, Reactive-ion etching (RIE), Ion beam etching (IBE), one or more other plasma etching processes, one or more chemical etching processes, and/or one or more other etching processes as would be understood by one of ordinary skill in the relevant arts.

In an exemplary embodiment, the etching of the hard mask 460, barrier layer 430 and first magnetic layer structure 410 are performed using multiple etching processes. For example, a first etching process is performed to remove the portion of the hard mask 460 and a second etching process is performed to remove the underlying portions of the barrier layer 430 and first magnetic layer structure 410.

In an exemplary embodiment where the hard mask 460 includes a self-aligned spacer, the etching process of can include a single etching process that removes exposed portions (e.g., portions not protected by the self-aligned spacer) of the barrier layer 430 and first magnetic layer structure 410. This single etching process can also remove some or all of the self-aligned spacer.

Following the removal of the corresponding portions of the hard mask 460, barrier layer 430, and first magnetic layer structure 410, a magnetoresistive device having the layer structure 200B is formed. In this example, and as illustrated in FIG. 4(*d*), the perimeter (and corresponding area) of the first magnetic layer structure 410 is larger than the perimeter (and corresponding area) of the second magnetic layer structure 440 such that only a portion of the first magnetic layer structure 410 is overlapped by the second magnetic layer structure 440. That is, the perimeter of the first magnetic layer structure 410 is spaced outward from the perimeter of the second magnetic layer structure 440.

In another exemplary embodiment, the hard masks 450 and 460 can be replaced by resist masks as mask layers, and removed again after structuring (e.g., etching) the first and second magnetic layer structures 410, 440.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

What is claimed is:

1. A magnetoresistive device, comprising:
   a first magnetic layer structure having a first length;
   a barrier layer having the first length and a uniform thickness, the barrier layer being disposed on the first magnetic layer structure; and
   a second magnetic layer structure disposed on the barrier layer, the second magnetic layer structure having a second length that is less than the first length, wherein the second magnetic layer structure includes a reference layer, a coupling layer disposed on the reference layer, a pinned layer disposed on the coupling layer, and an antiferromagnetic layer disposed on the pinned layer.

2. The magnetoresistive device of claim 1, wherein a first perimeter of the first magnetic layer structure defines a first area, the first perimeter being spaced from a perimeter of the second magnetic layer structure that defines a second area that is less than the first area, wherein the second area overlaps the first area.

3. The magnetoresistive device of claim 1,
   wherein the first magnetic layer structure has a magnetization configured to change in response to a varying external magnetic field; and
   wherein the second magnetic layer structure has a fixed or substantially fixed magnetization.

4. The magnetoresistive device of claim 1, wherein the first length and the second length extend parallel or substantially parallel to each other.

5. The magnetoresistive device of claim 1, wherein the second length is in a range of 10% to 90% of the first length.

6. The magnetoresistive device of claim 1, wherein the first magnetic layer structure comprises a free layer.

7. The magnetoresistive device of claim 6, wherein the free layer has a magnetization configured to change in response to a varying external magnetic field.

8. The magnetoresistive device of claim 1,
   wherein the pinned layer has a fixed magnetization or substantially fixed magnetization.

9. A method for manufacturing a magnetoresistive device, the method comprising:
   depositing a first magnetic layer structure, a barrier layer, a second magnetic layer structure, and a first mask layer on a seed layer, wherein the second magnetic layer structure includes a reference layer, a coupling layer disposed on the reference layer, a pinned layer disposed on the coupling layer, and an antiferromagnetic layer disposed on the pinned layer;

structuring the first mask layer and the second magnetic layer structure to expose a portion of the barrier layer and to define a perimeter of the second magnetic layer structure;

depositing a second mask layer on the exposed portion of the barrier layer to cover the exposed portion of the barrier layer and the perimeter of the second magnetic layer structure; and structuring a second portion of the barrier layer and a portion of the first magnetic layer disposed beneath the second portion of the barrier layer to expose a portion of the substrate and to define respective perimeters of the barrier layer and the first magnetic layer, the perimeters of the barrier layer and the first magnetic layer being equal, and the barrier layer having a uniform thickness, wherein an area defined by the perimeter of the second magnetic layer structure is contained within the perimeters of the barrier layer and the first magnetic layer, and the perimeter of the second magnetic layer is spaced from the perimeter of the first magnetic layer.

10. The method for manufacturing the magnetoresistive device of claim 9, wherein the depositing the first magnetic layer, the barrier layer, the second magnetic layer structure, and the first mask layer comprises:

depositing the first magnetic layer structure on the seed layer;

depositing the barrier layer on the first magnetic layer structure;

depositing the second magnetic layer structure on the barrier layer; and depositing the first mask layer on the second magnetic layer structure.

11. The method for manufacturing the magnetoresistive device of claim 9, wherein the second mask layer comprises a self-aligned spacer, and wherein the etching of the second portion of the barrier layer and the portion of the first magnetic layer disposed beneath the second portion of the barrier layer is performed in a single etching process.

12. The method for manufacturing the magnetoresistive device of claim 9, further comprising:

structuring a portion of the second mask layer to expose the second portion of the barrier layer.

13. The method for manufacturing the magnetoresistive device of claim 9, further comprising:

depositing the second mask layer on the first mask layer.

14. The method for manufacturing the magnetoresistive device of claim 9, wherein the first magnetic layer structure has a magnetization configured to change in response to a varying external magnetic field; and wherein the second magnetic layer structure has a fixed or substantially fixed magnetization.

15. The method for manufacturing the magnetoresistive device of claim 9, wherein the first magnetic layer structure comprises a sensor layer.

16. The method for manufacturing the magnetoresistive device of claim 15, wherein the sensor layer has a magnetization configured to change in response to a varying external magnetic field.

17. The method for manufacturing the magnetoresistive device of claim 9, wherein the pinned layer has a fixed magnetization or substantially fixed magnetization.

18. A magnetoresistive device, comprising:

a first magnetic layer structure including a free layer, the first magnetic layer structure having a first perimeter defining a first area and a magnetization configured to change in response to a varying external magnetic field;

a barrier layer having the first perimeter and a uniform thickness, the barrier layer being disposed on the free layer; and a second magnetic layer structure disposed on the barrier layer and including a reference layer, a coupling layer disposed on the reference layer, a pinned layer disposed on the coupling layer, and an antiferromagnetic layer disposed on the pinned layer, wherein the second magnetic layer structure has a fixed or substantially fixed magnetization and a second perimeter defining a second area that is less than the first area, and wherein the second perimeter is spaced from the first perimeter, and the second area overlaps the first area.

* * * * *